United States Patent
Fukuda

(10) Patent No.: US 7,663,189 B2
(45) Date of Patent: Feb. 16, 2010

(54) SILICON-ON-SAPPHIRE SEMICONDUCTOR DEVICE WITH SHALLOW LIGHTLY-DOPED DRAIN

(75) Inventor: Koichi Fukuda, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 299 days.

(21) Appl. No.: 11/288,273

(22) Filed: Nov. 29, 2005

(65) Prior Publication Data

US 2006/0138543 A1 Jun. 29, 2006

(30) Foreign Application Priority Data

Dec. 20, 2004 (JP) .............................. 2004-367856

(51) Int. Cl.
*H01L 27/12* (2006.01)
(52) U.S. Cl. ............................. 257/352; 257/E29.278
(58) Field of Classification Search ................ 257/336, 257/352, 315, 368, 347, 351, 353, E29.278, 257/E29.281, E29.287
See application file for complete search history.

(56) References Cited

U.S. PATENT DOCUMENTS

| | | | | |
|---|---|---|---|---|
| 4,199,773 A | * | 4/1980 | Goodman et al. | 257/351 |
| 5,936,278 A | * | 8/1999 | Hu et al. | 257/336 |
| 6,353,245 B1 | * | 3/2002 | Unnikrishnan | 257/347 |
| 6,596,554 B2 | * | 7/2003 | Unnikrishnan | 438/180 |
| 6,864,540 B1 | * | 3/2005 | Divakaruni et al. | 257/368 |
| 7,195,995 B2 | * | 3/2007 | Mouli | 438/529 |
| 2003/0162336 A1 | * | 8/2003 | Wei et al. | 438/166 |
| 2006/0051922 A1 | * | 3/2006 | Huang et al. | 438/282 |

FOREIGN PATENT DOCUMENTS

JP      2003-069033      3/2003

* cited by examiner

*Primary Examiner*—Thomas L Dickey
*Assistant Examiner*—Fazli Erdem
(74) *Attorney, Agent, or Firm*—Volentine & Whitt, P.L.L.C.

(57) ABSTRACT

A semiconductor device is created in a doped silicon layer at most one-tenth of a micrometer thick formed on and having an interface with a sapphire substrate. An oppositely doped source region is formed in the silicon layer. A gate electrode is formed above part of the silicon layer. A diffusion layer doped with the same type of impurity as the source region but at a lower concentration is formed in the silicon layer, extending into a first area beneath the gate electrode, functioning as a drain region or as a lightly-doped extension of a more heavily doped drain region. The depth of this diffusion layer is less than the thickness of the silicon layer. This comparatively shallow diffusion depth reduces current leakage by inhibiting the formation of a back channel.

18 Claims, 6 Drawing Sheets

SILICON-ON-SAPPHIRE SEMICONDUCTOR DEVICE WITH SHALLOW LIGHTLY-DOPED DRAIN

BACKGROUND OF THE INVENTION

1. Field of the Invention

The present invention relates to a semiconductor device in which a metal-oxide-semiconductor field-effect transistor is formed in a silicon-on-sapphire substrate with a comparatively thin silicon layer.

2. Description of the Related Art

Forming semiconductor devices in silicon-on-sapphire (SOS) substrates with a comparatively thick layer of silicon, typically a layer about 0.3 micrometer (0.3 μm) thick, is an established art. To form a lightly doped drain (LDD) layer in a metal-oxide-semiconductor field-effect transistor (MOSFET) in such a substrate, for example, for an n-channel MOSFET, it is known to implant ions of phosphorus, which is an n-type impurity, into the body area of the MOSFET with a dose of $3 \times 10^{13}$ ions/cm$^2$ and an energy of thirty kilo-electron volts (30 keV), forming an LDD layer with a thickness of about one-tenth of a micrometer (0.1 μm), as described in Japanese Patent Application Publication No. 2003-69033 (paragraphs 0024-0025 and FIG. 1).

Recently, however, SOS substrates with comparatively thin silicon layers, 0.1 μm thick or less, have come into use. These substrates have the advantage of enabling MOSFETs to operate in a fully depleted mode, but if the conventional technology described above is used, the resulting LDD layer, which is itself about 0.1 μm thick, may extend to the silicon-sapphire interface, causing a problem of increased leakage current in the off-state, when the gate-source voltage is zero volts (Vgs=0V). This problem is particularly serious in short-channel MOSFETs with a gate length of 1 μm or less. Use of thin-silicon SOS semiconductor devices with transistors of this type in battery-powered apparatus results in reduced battery life due, for example, to increased current flow in the standby state.

For reference, FIG. 1 shows an n-channel MOSFET 101, also referred to below as an nMOS device, having an LDD layer that reaches the silicon-sapphire interface. The nMOS device 101 is formed on an SOS substrate 4 comprising a sapphire substrate 2 and a silicon layer 3 at most 0.1 μm thick, which meet at an interface 5 indicated by a bold line. The nMOS device 101 includes: a source 6 and a drain 7 that are formed as n-type diffusions; a body region 8 formed as a p-type diffusion in the area between the source 6 and drain 7, where a channel forms when the device is in the on-state; a gate electrode 10 facing the body region 8 and insulated therefrom by a gate oxide film 9 such as a silicon oxide (SiO$_2$) film; side walls 11 formed as silicon oxide films or other dielectric films on both sides of the gate electrode 10; and lightly doped n-type diffusion layers referred to as LDD layers 113, 114 formed in the body region beneath the gate electrode 10 on both the source side and the drain side, adjoining one end of the source 6 and one end of the drain 7, having a lower n-type impurity concentration than the source 6 and drain 7.

The inventor has investigated the cause of current leakage in this type of nMOS device 101, having a source side LDD 113 and a drain side LDD 114 that reach the interface 5, by using a device simulation program. FIG. 2 shows a simulation result indicating drain current characteristics of an nMOS device with a short channel; FIG. 3 shows a simulation result indicating the electron density distribution in this nMOS device when current leakage occurs; FIG. 4 shows a simulation result indicating ideal characteristics of an nMOS device with a short channel.

These simulation results were calculated for a short-channel nMOS device 101 formed on an SOS substrate 4 comprising a silicon layer 3 0.1 μm thick formed on a sapphire substrate 2, having a gate length of 0.25 μm. As shown in FIG. 2, the drain current per unit width (1 μm) of the gate 10 is $10^{-8}$ A/μm when the drain-source voltage Vds is 2.5 V and the gate-source voltage Vgs is 0 V (the off-state) This result shows a current leakage significantly higher than in the ideal off-state (drain current $10^{-10}$ A/μm).

FIG. 3 shows the electron density distribution in the device during this high leakage current flow, showing contours of electron density increasing by factors of ten from E=$10^{14}$/cm$^3$ to E=$10^{20}$/cm$^3$. The electron density contours equal to and less than E=$10^{17}$/cm$^3$ fold back to form an inversion layer in the body region 8 on the interface 5 between the silicon layer 3 and the sapphire substrate 2, in the area circled with the dashed line, forming an undesired back channel.

This simulation result indicates that current leakage in the off-state is caused by a back channel formed when a positive drain-source voltage is applied while the gate-source voltage is zero. This back channel differs from the channel (front channel) formed on the gate side of the body region 8 when a positive voltage is applied to the gate 10.

SUMMARY OF THE INVENTION

An object of the present invention is to suppress current leakage through a back channel in MOSFETs formed in an SOS substrate with a silicon layer at most 0.1 μm thick.

The invention provides a semiconductor device formed in a silicon layer at most 0.1 μm thick doped with an impurity of a first conductive type, formed on and having an interface with a sapphire substrate. A source region doped with an impurity of a second conductive type is formed in the silicon layer. A gate electrode is formed above part of the silicon layer. A first diffusion layer is formed in the silicon layer, extending into a first area beneath the gate electrode. The first diffusion layer is doped with an impurity of the second conductive type but at a lower concentration than in the source region, and has a diffusion depth less than the thickness of the silicon layer.

The semiconductor device may have a drain region doped similarly to the source region. The first diffusion layer then extends from the drain region into the first area. Alternatively, the first diffusion layer itself may function as the drain region.

The semiconductor device may also have a second diffusion layer similar to the first diffusion layer but extending from the source region into a second area of the silicon layer beneath the gate electrode.

Since the first and second diffusion layers do not reach the silicon-sapphire interface, any back channel that forms in the silicon layer at this interface must extend between the source and drain regions. Such a back channel is necessarily longer than the normal channel formed between the first and second diffusion layers, or between the first diffusion layer and the source region, and therefore forms less readily than in a device in which the diffusion layers extended to the interface. Leakage current is reduced accordingly.

DETAILED DESCRIPTION OF THE INVENTION

Figure 1:
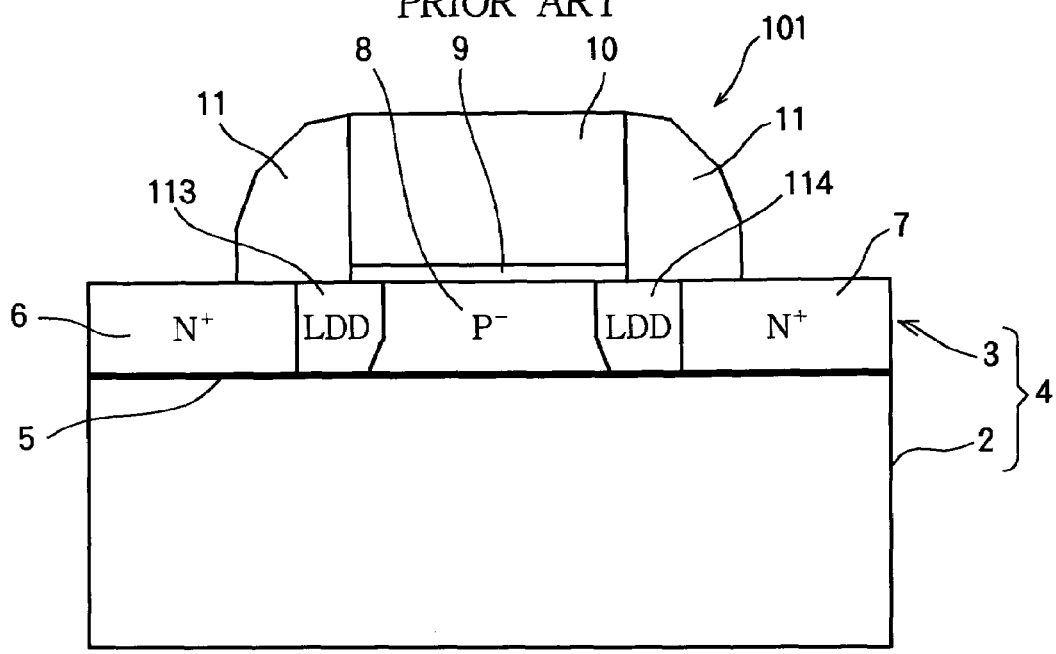
FIG. 1 is a diagram illustrating a conventional short-channel nMOS device having LDD layers that reach the silicon-sapphire interface.
Figure 2:
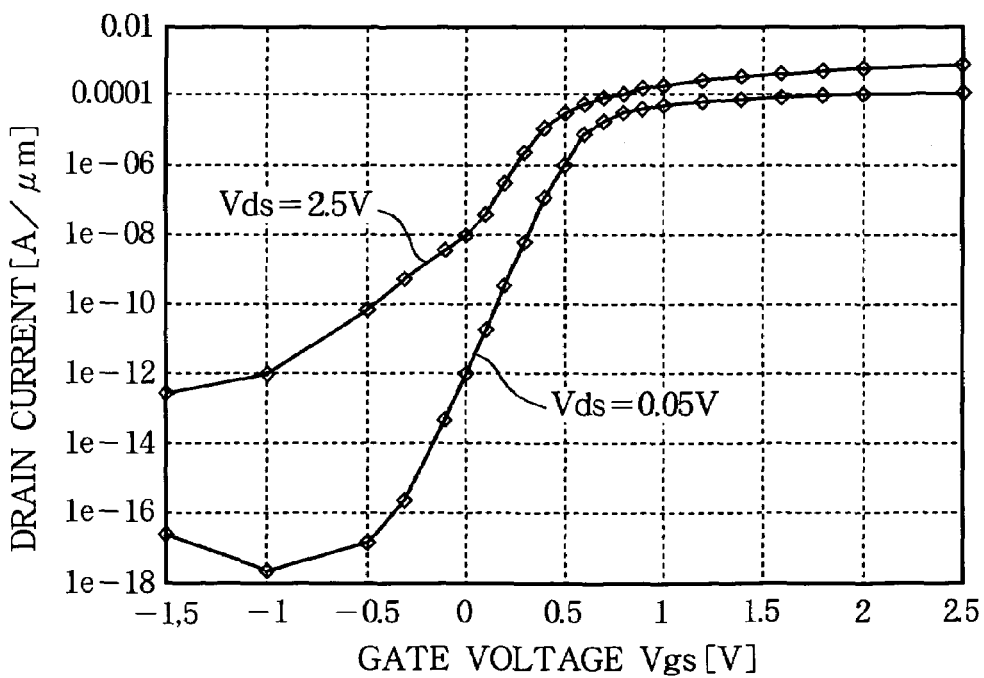
FIG. 2 is a graph showing a simulation result indicating electrical characteristics of the nMOS device in FIG. 1.

Embodiments of the invention will now be described with reference to the attached drawings, in which like elements are indicated by like reference characters.

FIRST EMBODIMENT

Figure 5:
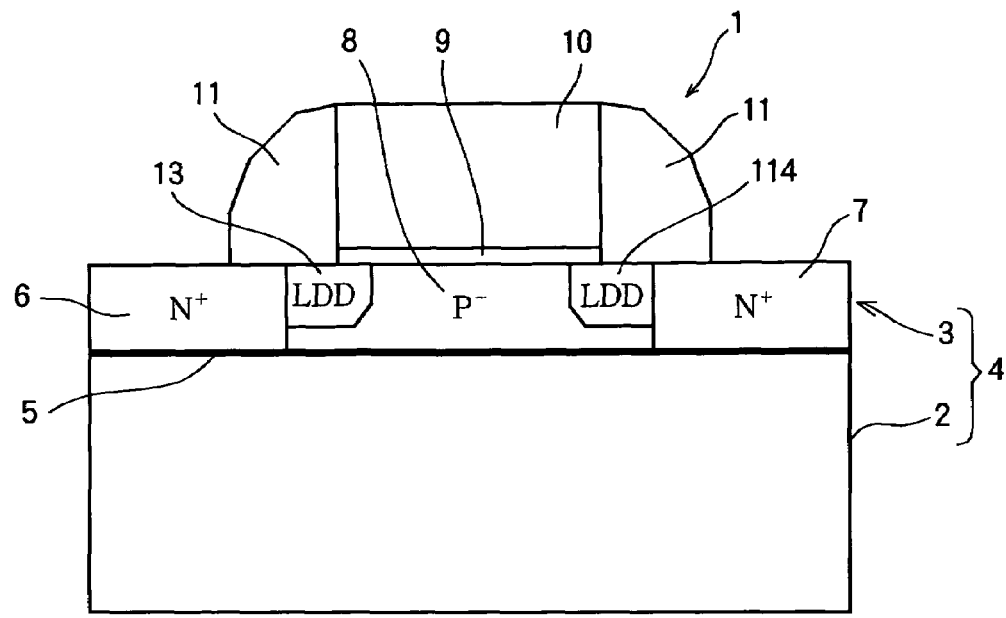
FIG. 5 is a diagram illustrating an nMOS device according to a first embodiment of the invention.

Referring to FIG. 5, the first embodiment is an nMOS device 1 having a sapphire substrate 2 and a thin silicon layer 3 formed on the sapphire substrate 2. The thickness of the silicon layer 3 is at most 0.1 µm; a thickness of 0.07 µm will be assumed below. The sapphire substrate 2 and silicon layer 3 constitute an SOS substrate 4. A source 6 and drain 7 are formed as n-type diffusions that reach the interface 5 between the silicon layer 3 and sapphire substrate 2. A p-type body region 8 occupies the space in the silicon layer 3 between the source 6 and drain 7. A gate oxide film 9 is formed on the body region 8, and a gate 10 is formed on the gate oxide film 9. A pair of side walls 11 are formed on the sides of the gate 10. The gate oxide film 9 and side walls 11 are formed as, for example, silicon oxide films. A lightly doped n-type diffusion layer or LDD layer 13 is formed in the body region 8 between the gate 10 and the source 6, adjoining one end of the source 6. Another LDD layer 14 is formed in the body region 8 between the gate 10 and the drain 7, adjoining one end of the drain 7. The LDD layers 13, 14 have a lower n-type impurity concentration than the source 6 and drain 7, and extend from the surface of the silicon layer 3 only part way to the interface 5 with the sapphire substrate 2. The LDD layers 13, 14 control the flow of current in the front channel formed in the body region 8 near the gate oxide film 9 when a voltage is applied to the gate 10.

The source 6 and drain 7 may extend from the surface of the silicon layer 3 to the interface 5 with the sapphire substrate 2, as shown in the drawing, but this is not necessary. The source 6 and drain 7 may extend only part way to the interface 5.

The diffusion depth of the LDD layers 13, 14 is preferably at least one-half but less than three-fourths of the thickness of the silicon layer 3, the most preferable diffusion depth being substantially two-thirds the thickness of the silicon layer 3. The reason is that if the diffusion depth is less than half the thickness of the silicon layer 3, the current driving capability of the transistor is lowered because of heightened source-drain resistance, while if the diffusion depth is three-fourths or more the thickness of the silicon layer 3, a back channel can easily form in the silicon layer 3 adjacent the interface 5 with the sapphire substrate 2, giving rise to current leakage.

Specifically, since the film thickness of the silicon layer 3 is 0.07 µm, the preferred diffusion depth of the LDD layers 13, 14 is about 0.047 µm. In order to form LDD layers with this depth, an n-type impurity is implanted with, for example, a dose of $10^{18}$ ions/cm² at an energy of 5 keV. These parameters represent a higher ion concentration and a lower energy than in the ion implantation process used in the prior art mentioned earlier. The LDD layers 13, 14 may be formed simultaneously under identical conditions, or formed separately under slightly differing conditions. If formed separately, they may have different diffusion depths, impurity concentrations, and other characteristics.

Figure 6:
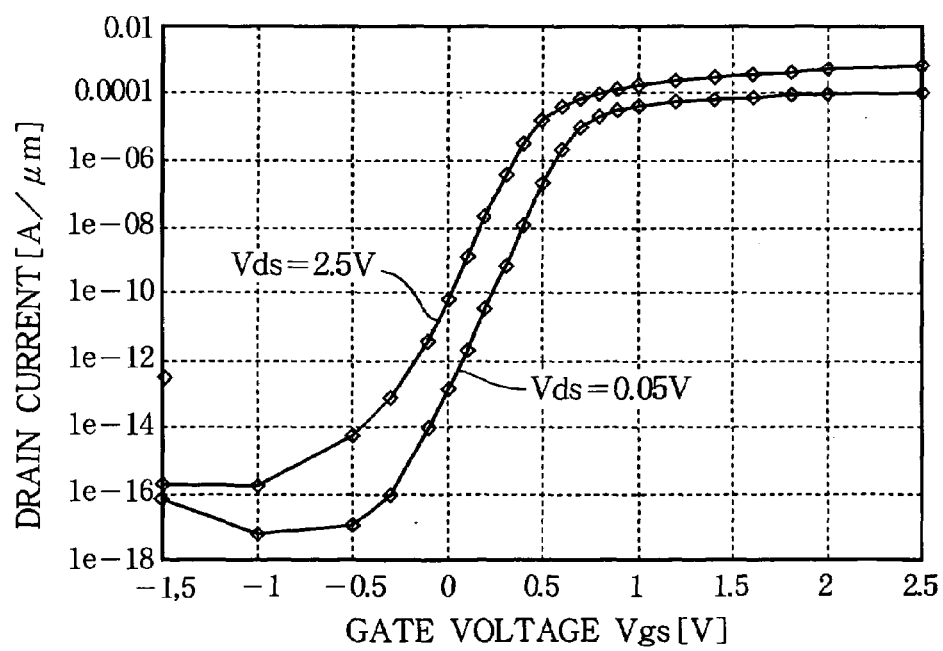
FIG. 6 is a graph showing a simulation result indicating electrical characteristics of the nMOS device in FIG. 5.
Figure 7:
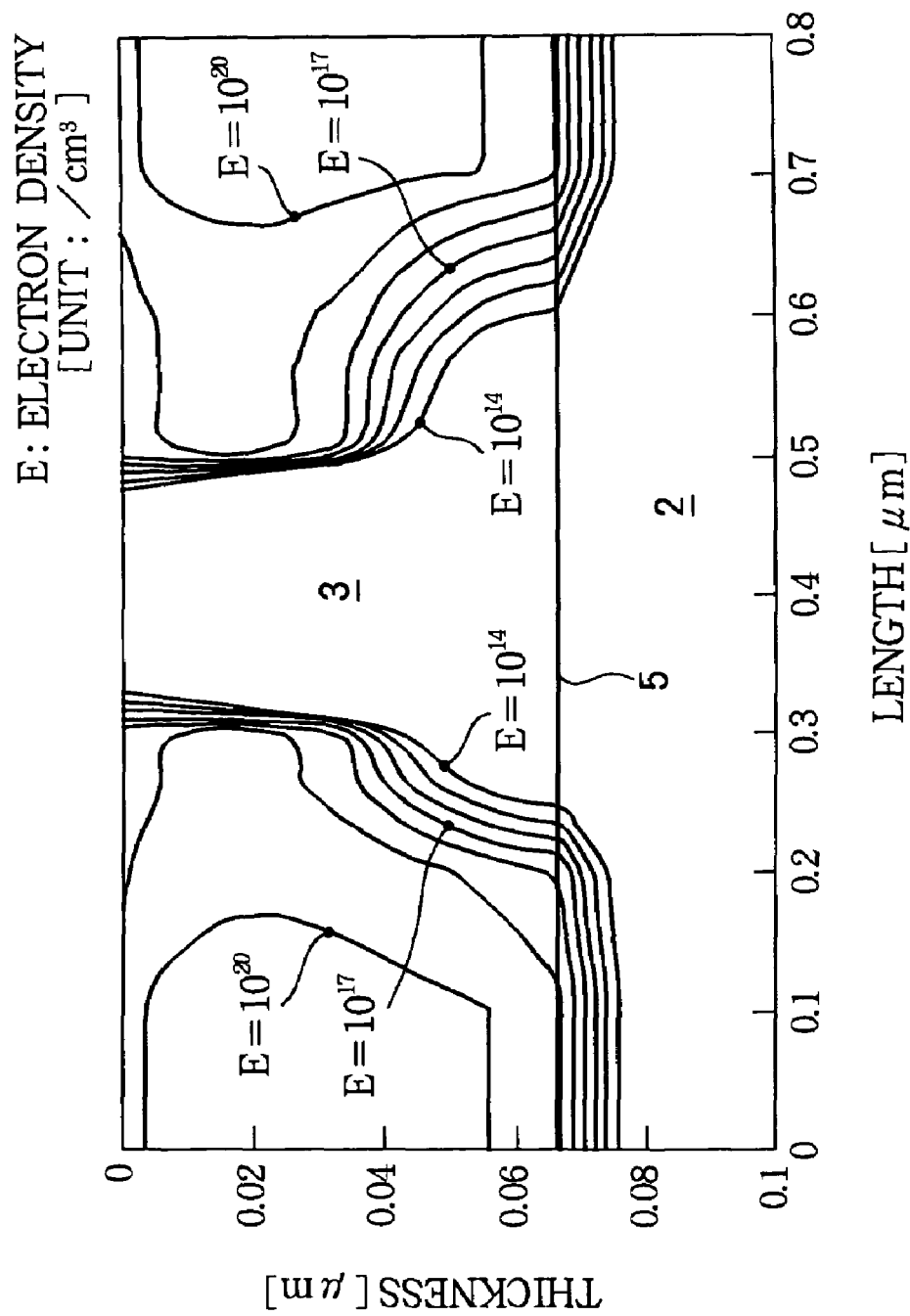
FIG. 7 is a graph showing a simulation result indicating the electron density distribution of the nMOS device in FIG. 5.

FIGS. 6 and 7 show results of simulation of an nMOS device 1 having LDD layers 13, 14 with depths not reaching the interface 5.

Figure 3:
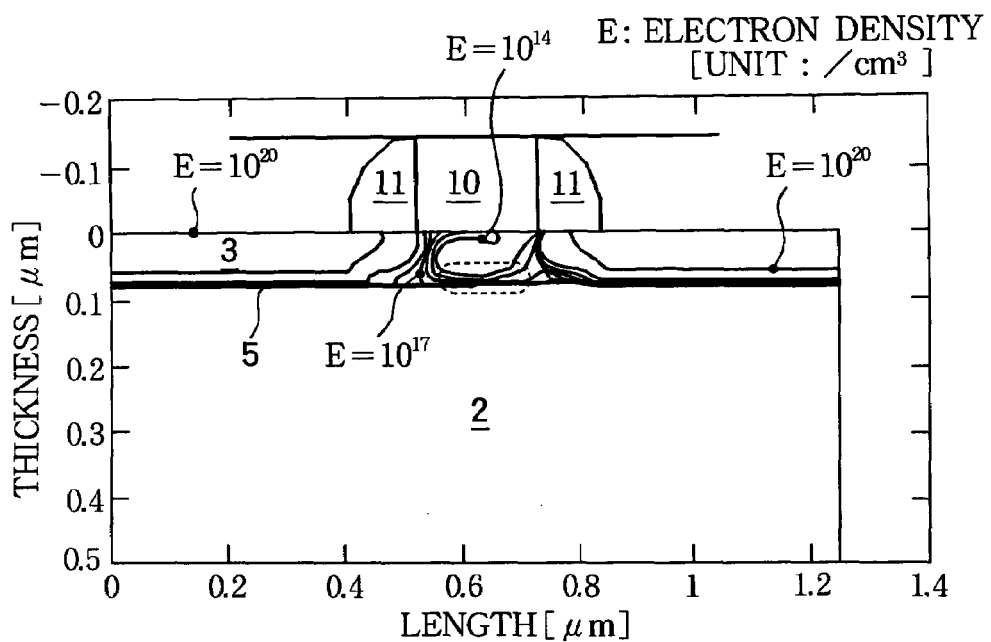
FIG. 3 is a graph showing a simulation result indicating electron density distribution when current leakage occurs in the nMOS device in FIG. 1.
Figure 4:
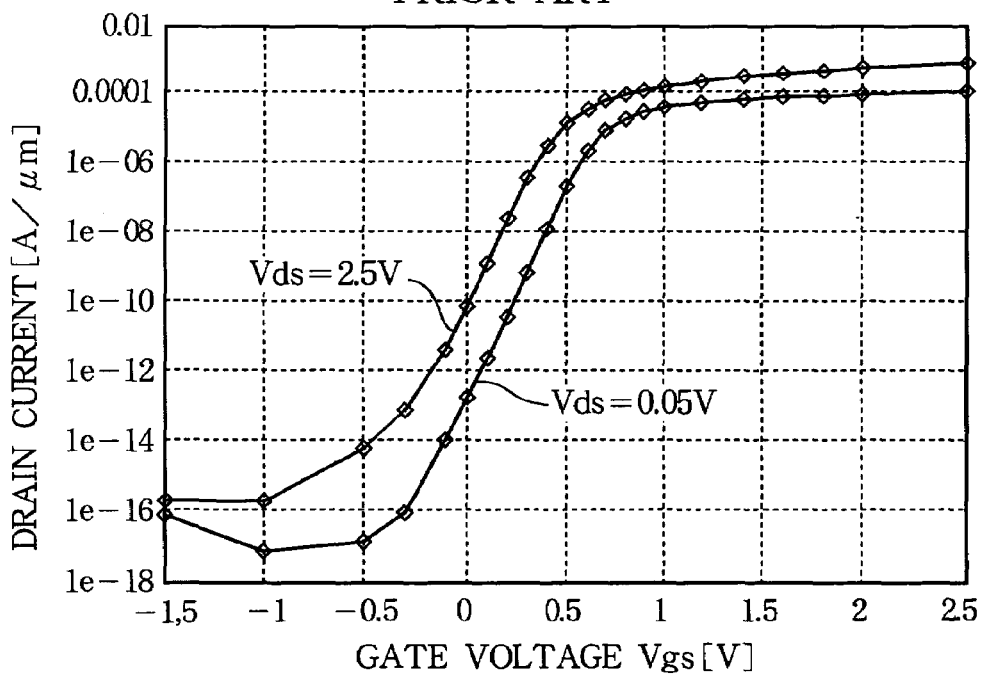
FIG. 4 is a graph showing a simulation result indicating ideal electrical characteristics of a short-channel nMOS device.

FIG. 6 shows results of simulation of the electrical characteristics of the nMOS device 1 of the first embodiment. The nMOS device 1 has nearly the ideal electrical characteristics that were shown in FIG. 4: in the off-state, when the gate-source voltage is zero, the drain current is less than $10^{-10}$ A/µm. FIG. 7 shows the result of simulation of the electron density distribution in the nMOS device 1 of the first embodiment in the off-state, for a drain-source voltage of 2.5 V with zero gate-source voltage. The fold-back noted in FIG. 3 is not observed.

When the depths of the source LDD layer 13 and drain LDD layer 14 are reduced so that they do not reach the silicon-sapphire interface 5, the effective channel length of the front channel is not decreased, but if a back channel forms, it must have a longer effective length. This inhibits the formation of a back channel, thereby mitigating the increase in current leakage that would otherwise attend the use of thin silicon layer 3.

In the first embodiment, a source 6 and a drain 7 are formed in the body region 8 of the nMOS device 1 on opposite sides of the gate 10, and a pair of LDD layers which do not reach the silicon-sapphire interface are formed extending from the facing ends of the source and drain into the area under the gate. In the on-state, a front channel forms to conduct current over the comparatively short distance between the LDD layers. In the off-state, any back channel that forms at the silicon-sapphire interface in the body region must conduct current through the comparatively long effective distance between the source and drain. The length of this distance inhibits the formation of a back channel, thereby counteracting the tendency of the thinness of the silicon layer 3 to lead to an increase in current leakage.

SECOND EMBODIMENT

Figure 8:
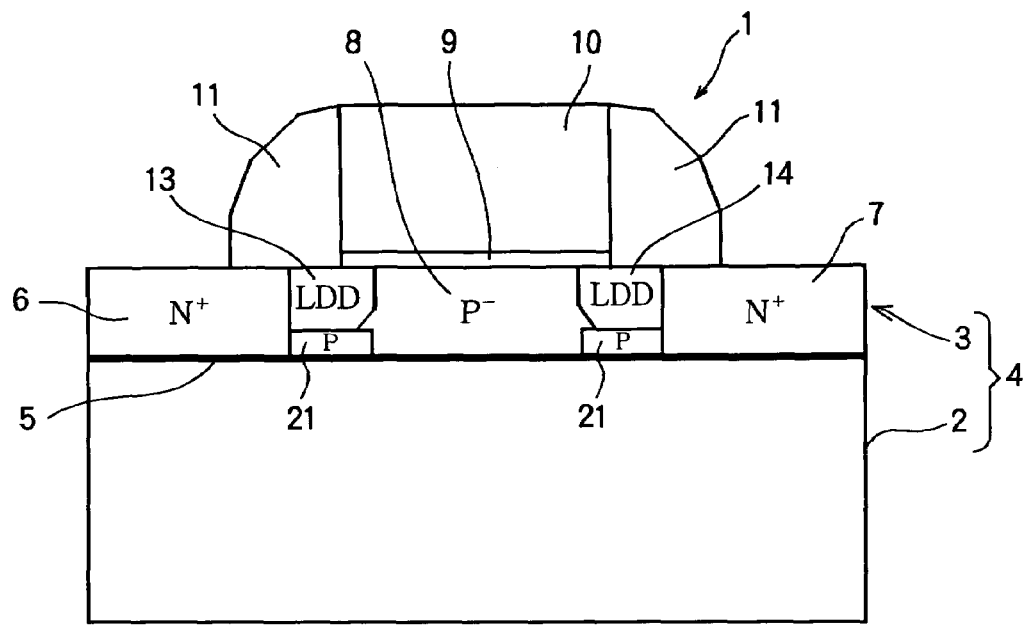
FIG. 8 is a diagram illustrating an nMOS device according to a second embodiment of the invention.

Referring to FIG. 8, the nMOS device 1 in the second embodiment is similar to the nMOS device in the first embodiment, but includes a pair of high-concentration diffusion layers 21, formed between the source LDD layer 13 and the interface 5 and between the drain LDD layer 14 and the interface 5, respectively. These diffusion layers 21 are doped with an impurity of same type (in this case, the p type) as the impurity in the body region 8, but at a higher concentration.

Being disposed below the LDD layers 13, 14, the high-concentration diffusion layers 21 do not impede the formation of a front channel extending between the LDD layers 13 and 14 in the on-state. They do, however, impede the formation of a back channel extending between the source 6 and drain 7 at the silicon-sapphire interface 5 in the off-state, because of the heightened concentration of the p-type impurity. More specifically, the high-concentration diffusion layer 21 beneath the LDD layer 14 inhibits the expansion of the depletion region around the drain 7, and the high-concentration diffusion layer 21 beneath LDD layer 13 inhibits the expansion of the depletion region in front of the source 6.

In the second embodiment, as in the first embodiment, a source 6 and a drain 7 are formed in the body region 8 of the nMOS device 1 on opposite sides of the gate 10, and a pair of LDD layers which do not reach the silicon-sapphire interface are formed extending from the facing ends of the source and drain into the area under the gate. In the on-state, a front channel forms to conduct current over the comparatively short distance between the LDD layers. In the off-state, any back channel that forms at the silicon-sapphire interface in the body area must conduct current through the comparatively long effective distance between the source and drain, and must also contend with the increased concentration of the p-type impurity in the high-concentration diffusion layers 21 beneath the LDD layers 13 and 14. Both of these factors inhibit the formation of a back channel, thereby inhibiting current leakage even more effectively than in the first embodiment.

THIRD EMBODIMENT

Figure 9:
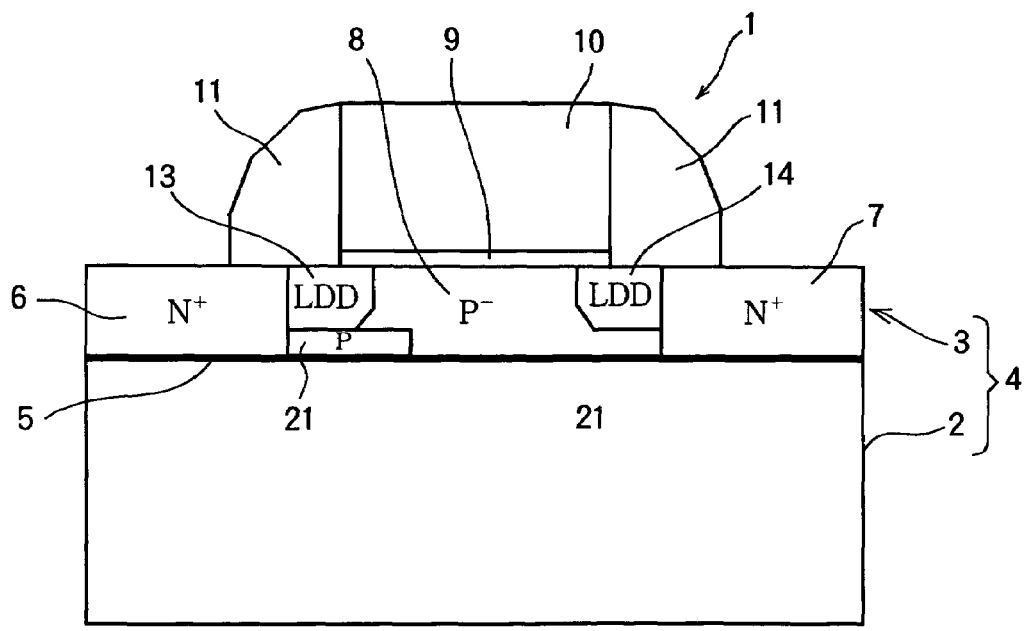
FIG. 9 is a diagram illustrating an nMOS device according to a third embodiment.

Referring to FIG. 9, the nMOS device 1 in the third embodiment is also similar to the nMOS device 1 in the first embodiment, but includes a high-concentration diffusion layer 21 doped with a p-type impurity at a higher concentration than in the body region 8, disposed between the source LDD layer 13 and the interface 5 and extending partly beyond the edge of the LDD layer 13 into the body region 8. The third embodiment is thus similar to the second embodiment, except that there is no high-concentration diffusion layer on the drain side, and the spatial extent of the high-concentration diffusion layer 21 on the source side is increased in compensation.

Being disposed at the silicon-sapphire interface 5, the high-concentration diffusion layer 21 in the third embodiment does not affect the formation of a front channel below the gate 10 in the on-state, but it does impede the formation of a back channel in the off-state. Essentially, the high-concentration diffusion layer 21 raises the silicon-sapphire threshold voltage of the device in the area near the interface 5 in front of the drain 6. An advantage of the third embodiment, as compared with the second embodiment, is that since no high-concentration diffusion layer is formed below the LDD layer 14 in front of the drain 7, the parasitic capacitance of the pn junction between the body region 8 and the drain 7 is not increased; consequently, there is no reduction in the operating speed of the device.

In the third embodiment, as in the first embodiment, a source 6 and a drain 7 are formed in the body region 8 of the nMOS device 1 on opposite sides of the gate 10, and a pair of LDD layers which do not reach the silicon-sapphire interface are formed extending from the facing ends of the source and drain into the area under the gate. In the on-state, a front channel forms to conduct current over the comparatively short distance between the LDD layers. In the off-state, any back channel that forms at the silicon-sapphire interface in the body area must conduct current through the comparatively long distance between the source and drain, and must also overcome the increased p-type impurity concentration in the high-concentration diffusion layer 21 in the area in front of the source 6. Both of these factors inhibit the formation of a back channel, thereby inhibiting current leakage as in the second embodiment, but with no loss of operating speed due to increased parasitic drain capacitance.

FOURTH EMBODIMENT

Figure 10:
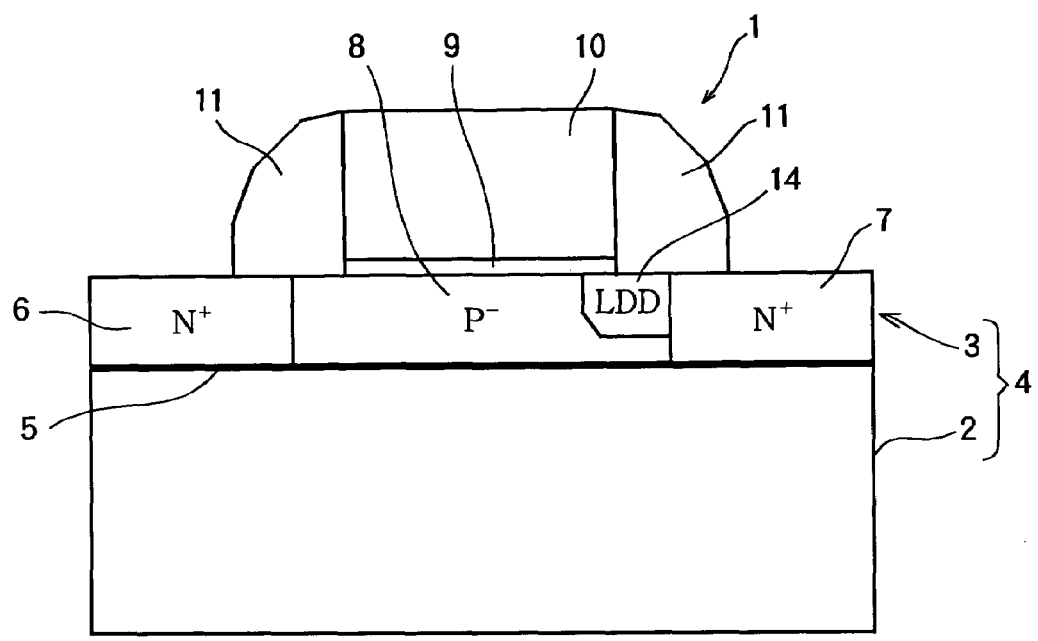
FIG. 10 is a diagram illustrating an nMOS device according to a fourth embodiment.

Referring to FIG. 10, the nMOS device 1 in the fourth embodiment is also similar to the nMOS device 1 in the first embodiment, but has only one LDD layer 14, disposed adjacent the drain 7.

One purpose of the LDD layer 14 is to prevent device failure by reducing the electric field in the vicinity of the body-drain pn junction. In the absence of an LDD layer, the electric field in this vicinity can become high enough to lead to hot-electron damage in the current-conducting state, when the reverse bias due to the drain-source voltage is added to the intrinsic reverse bias of the pn junction. The lightly-doped extension of the source 6 is less necessary, because there the drain-source voltage produces a forward bias that counteracts the intrinsic reverse bias of this pn junction. Thus even though the LDD layer 14 is necessary on the drain side, the LDD layer 13 on the source side in the first embodiment can be omitted without risk of device failure. Omitting the LDD layer 13 further impedes the formation of a back channel, as compared with the first embodiment.

In FIG. 10, the edge of the source 6 is offset back from the gate 10. In a variation of the fourth embodiment, the edge of the source 6 is moved forward toward the gate 10, to facilitate the formation of a front channel in the on-state. The gap between the LDD layer 14 and the interface 5 still inhibits the formation of a back channel in the off-state.

In the fourth embodiment, as in the first embodiment, a source 6 and a drain 7 are formed in the body region 8 of the nMOS device 1 on opposite sides of the gate 10, and an LDD layer which does not reach the silicon-sapphire interface is formed extending from the end of the drain into the area under the gate. In the on-state, a front channel forms to conduct current over the comparatively short distance between the source and the LDD layer. In the off-state, any back channel that forms at the silicon-sapphire interface in the body area must be long enough to reach the drain, instead of simply long enough to reach the LDD layer. Consequently, a back channel has less tendency to form, and current leakage is reduced as compared with a device having an LDD layer extending to the silicon-sapphire interface.

FIFTH EMBODIMENT

Figure 11:
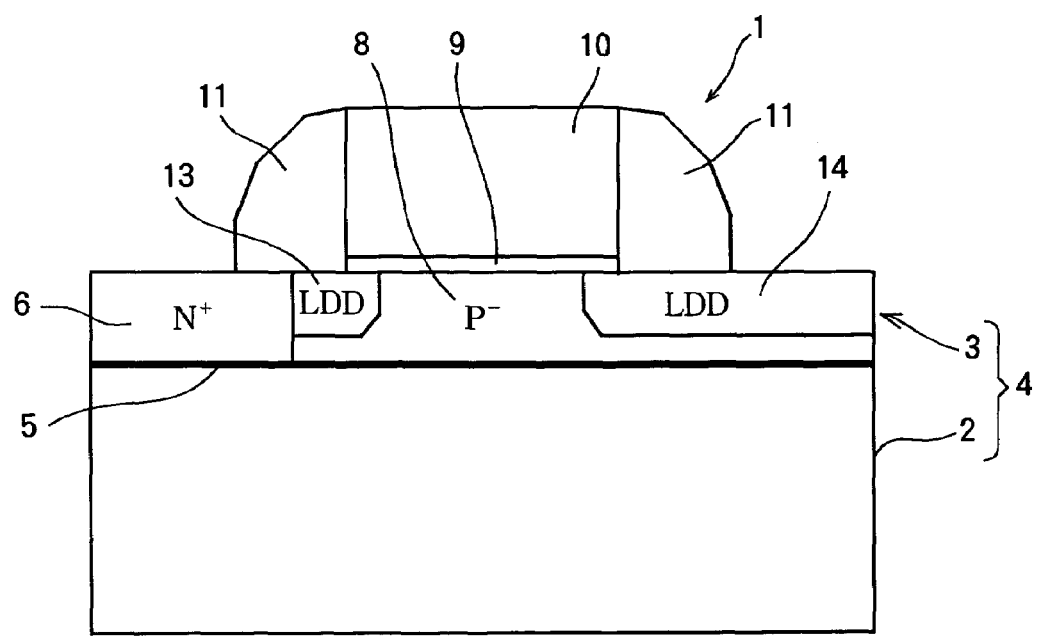
FIG. 11 is a diagram illustrating an nMOS device according to a fifth embodiment.

Referring to FIG. 11, the nMOS device 1 in the fourth embodiment is similar to the device in the first embodiment except that the entire drain is lightly doped; that is, the LDD layer 14 on the drain side is extended to the right in the drawing, beyond the side wall 11, to take the place of the heavily doped drain in the first embodiment. This LDD layer 14 need not have the same concentration of n-type impurities as the LDD layer 13 on the source side, but it has a lower impurity concentration than the concentration in the source 6, and like LDD layer 13, it extends only partway toward the silicon-sapphire interface 5.

When the nMOS device 1 in the first embodiment operates in the saturation region, carriers move through the LDD layer 14 at a saturation velocity that does not change significantly if the LDD layer 14 is lengthened. Accordingly, lengthening the LDD layer 14 to function as the drain of the nMOS device 1 in fifth embodiment does not greatly reduce the saturation current conducted by the device, while elimination of the heavily doped drain further inhibits the formation of a back channel in the off-state.

In the fifth embodiment, as in the first embodiment, a source 6 and an adjacent LDD layer are formed in the body region 8 on one side of the of the gate 10. An LDD layer that does not reach the silicon-sapphire interface and that functions as the drain of the device is formed in the body region 8 on the other side of the gate 10. In the on-state, a front channel forms to conduct current over the comparatively short distance between the two LDD layers. In the off-state, the light doping of the LDD layer that functions as the drain greatly inhibits the expansion of the depletion region on the drain side of the device, thereby inhibiting the formation of a back channel and reducing current leakage in the off-state.

The MOSFETs in the preceding embodiments were n-channel devices, but the invention is also applicable a p-channel MOS devices and gives effects similar to those described above.

Those skilled in the art will recognize that further variations are possible within the scope of the invention, which is defined in the appended claims.

What is claimed is:

1. A semiconductor device formed on a sapphire substrate, comprising:
   a silicon layer at most one-tenth of a micrometer (0.1 μm) thick having opposite first and second surfaces, the second surface on and having an interface with the sapphire substrate, the silicon layer doped with an impurity of a first conductive type;
   a source region in the silicon layer, doped with an impurity of a second conductive type;
   a gate electrode formed above part of the silicon layer;
   a first diffusion layer in the silicon layer, extending into a first area beneath the gate electrode, having a diffusion depth less than the thickness of the silicon layer, doped with an impurity of the second conductive type but having a lower impurity concentration than the source region; and
   a first high-concentration diffusion layer in the silicon layer between and in contact with both the first diffusion layer and said interface, and doped with an impurity of the first conductive type but having a higher impurity concentration than in the silicon layer under the gate electrode, the first high-concentration diffusion layer separated away from the first surface of the silicon layer.

2. The semiconductor device of claim 1, wherein the diffusion depth of the first diffusion layer is at least one-half the thickness of the silicon layer.

3. The semiconductor device of claim 2, wherein the diffusion depth of the first diffusion layer is less than three-fourths the thickness of the silicon layer.

4. The semiconductor device of claim 3, wherein the diffusion depth of the first diffusion layer is substantially two-thirds the thickness of the silicon layer.

5. The semiconductor device of claim 1, further comprising a drain region in the silicon layer, doped with an impurity of the second conductive type, wherein:
   the first diffusion layer extends from the drain region into said first area; and
   the drain region has a higher impurity concentration than the first diffusion layer.

6. The semiconductor device of claim 5, further comprising a second diffusion layer in the silicon layer, extending from the source region into a second area beneath the gate electrode, having a diffusion depth less than the thickness of the silicon layer, doped with an impurity of the second conductive type but having a lower impurity concentration than the source region.

7. The semiconductor device of claim 6, wherein the diffusion depth of the second diffusion layer is at least one-half the thickness of the silicon layer.

8. The semiconductor device of claim 7, wherein the diffusion depth of the second diffusion layer is less than three-fourths the thickness of the silicon layer.

9. The semiconductor device of claim 8, wherein the diffusion depth of the second diffusion layer is substantially two-thirds the thickness of the silicon layer.

10. The semiconductor device of claim 6, further comprising a second high-concentration diffusion layer in the silicon layer between and in contact with both the second diffusion layer and said interface, and doped with an impurity of the first conductive type but having a higher impurity concentration than in the silicon layer between the first diffusion layer and the second diffusion layer, the second high-concentration diffusion layer separated away from the first surface of the silicon layer.

11. The semiconductor device of claim 1, further comprising a second diffusion layer in the silicon layer, extending from the source region into a second area beneath the gate electrode, having a diffusion depth less than the thickness of the silicon layer, and doped with an impurity of the second conductive type but having a lower impurity concentration than the source region, wherein the first diffusion layer functions as a drain region.

12. The semiconductor device of claim 11, wherein the diffusion depth of the second diffusion layer is at least one-half the thickness of the silicon layer.

13. The semiconductor device of claim 12, wherein the diffusion depth of the second diffusion layer is less than three-fourths the thickness of the silicon layer.

14. The semiconductor device of claim 13, wherein the diffusion depth of the second diffusion layer is substantially two-thirds the thickness of the silicon layer.

15. A semiconductor device formed on a sapphire substrate, comprising:
   a silicon layer having a body region on the sapphire substrate and an interface with the sapphire substrate, the body region doped with an impurity of a first conductive type, the silicon layer having a thickness not greater than 0.1 μm;
   a source region in the silicon layer, doped with an impurity of a second conductive type;
   a gate electrode above part of the silicon layer;
   a first diffusion layer in the silicon layer, extending into a first area beneath the gate electrode and sandwiched directly between the source region and the body region, the first diffusion layer having a diffusion depth less than a thickness of the silicon layer, and doped with an impurity of the second conductive type to have a lower impurity concentration than the source region; and
   a first high-concentration diffusion layer directly beneath the first diffusion layer between the sapphire substrate and the first diffusion layer, the first high-concentration diffusion layer doped with an impurity of the first conductive type and having an impurity concentration greater than an impurity concentration of the body region.

16. The semiconductor device of claim 15, further comprising:
   a drain region in the silicon layer, doped with an impurity of the second conductive type; and
   a second diffusion layer in the silicon layer, extending into a second area beneath the gate electrode and sandwiched directly between the drain region and the body region, the second diffusion layer having a diffusion depth less than the thickness of the silicon layer, and doped with an impurity of the second conductive type to have a lower impurity concentration than the drain region.

17. The semiconductor device of claim 16, further comprising a second high-concentration diffusion layer under the second diffusion region between the sapphire substrate and the second diffusion layer, the second high-concentration diffusion layer doped with an impurity of the first conductive type and having an impurity concentration greater than an impurity concentration of the body region.

18. The semiconductor device of claim 15, wherein the diffusion depth of the first diffusion layer is substantially two-thirds the thickness of the silicon layer.

* * * * *